United States Patent
Hansen et al.

(10) Patent No.: US 6,720,825 B2
(45) Date of Patent: Apr. 13, 2004

(54) METHOD AND CIRCUIT FOR REDUCTION OF AUDIBLE TURN-ON AND TURN-OFF TRANSIENTS IN SWITCHING AMPLIFIERS

(75) Inventors: Thomas H. Hansen, Værløse (DK); Lars Risbo, Copenhagen (DK); Venkateswar R. Kowkutla, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/104,853

(22) Filed: Mar. 22, 2002

(65) Prior Publication Data
US 2003/0179037 A1 Sep. 25, 2003

(51) Int. Cl.⁷ .................................................. H03F 3/38
(52) U.S. Cl. ........................ 330/10; 330/207 A; 330/251
(58) Field of Search ............................... 330/10, 207 A, 330/251

(56) References Cited

U.S. PATENT DOCUMENTS

2002/0024383 A1 * 2/2002 Botti et al. .................. 330/10

FOREIGN PATENT DOCUMENTS

JP     59017710 A  * 1/1984 .................. 330/10

OTHER PUBLICATIONS

Webster's Ninth New Collegiate Dictionary 1991 p. 783.*

Higuchi et al., "The Robust Control of PWM Power Amplifier by the Approximate 2–degree of Freedom Digital Integral–Type Control System" 26$^{th}$ Annual Conference of the IEEE Industrial Electronics Society IECON 2000, vol. 4, 2000 pp 2297–2302.*

* cited by examiner

Primary Examiner—Michael B Shingleton
(74) Attorney, Agent, or Firm—W. Daniel Swayze, Jr.; W. James Brady; Frederick J. Telecky, Jr.

(57) ABSTRACT

A system and method for reducing audible turn-on and turn-off transients in switching amplifiers employs a frequency shaped start sequence in front of a modulated zero-signal or a frequency shaped stop sequence following a modulated zero-signal.

8 Claims, 10 Drawing Sheets

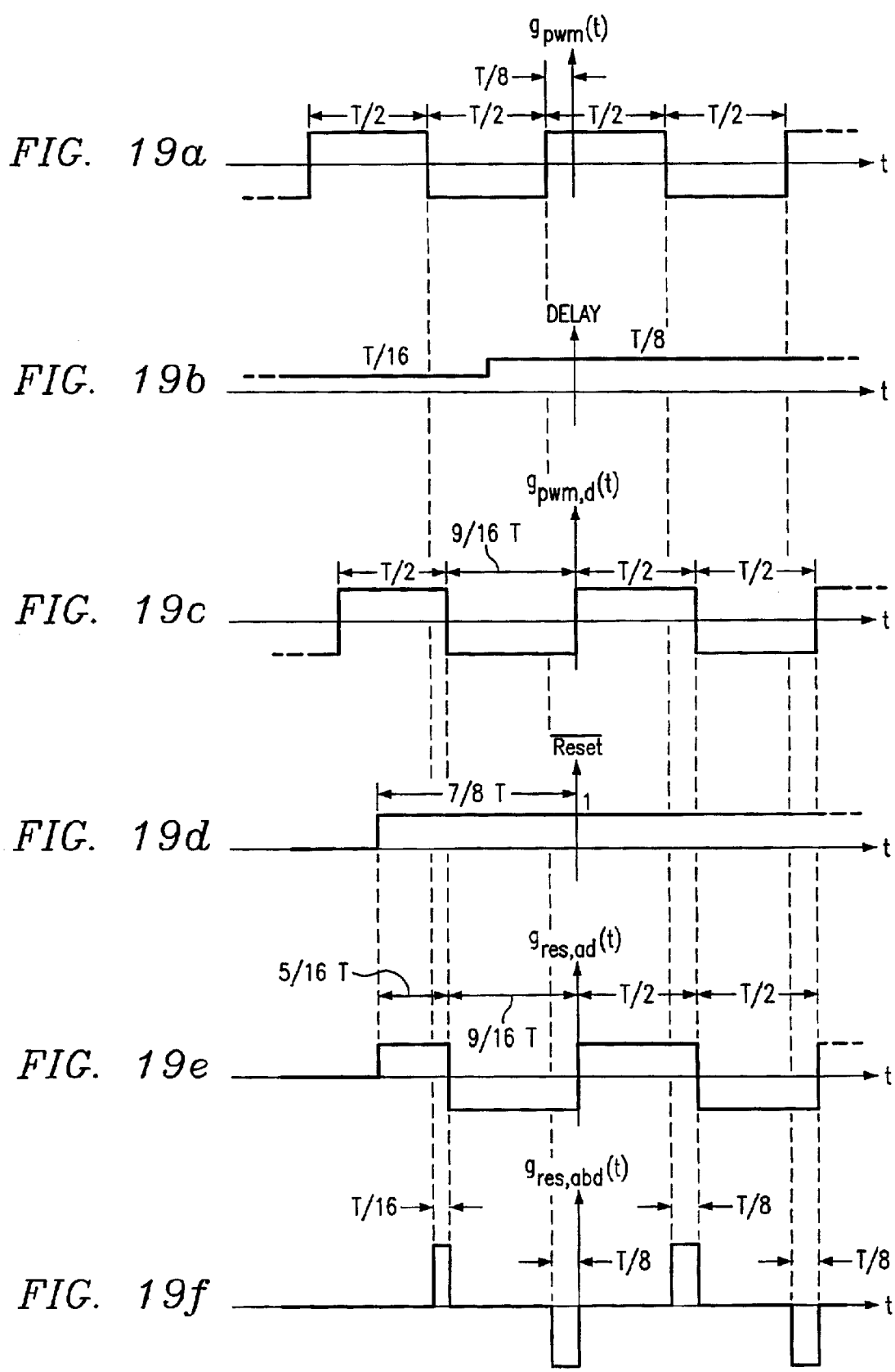

METHOD AND CIRCUIT FOR REDUCTION OF AUDIBLE TURN-ON AND TURN-OFF TRANSIENTS IN SWITCHING AMPLIFIERS

BACKGROUND OF THE INVENTION

1. Field of the Invention

This invention relates generally to switching audio amplifiers, and more particularly to a method and circuit for reducing audible transients associated with start-up, shutdown, mute and other changes of operational mode in switching audio amplifiers.

2. Description of the Prior Art

A common problem when designing audio equipment is to avoid audible transients such as "clicks" and "pops" at power-up, shutdown, mute, and the like. Transients are avoided in traditional audio amplifiers during power-up and shutdown by disconnecting the loudspeaker using a mechanical relay when transients might occur from the output stage.

When the modulation starts or stops in a pulse width modulation (PWM) amplifier, there will be certain transients with energy in the audio band, depending on the actual modulation scheme. The transients occur even though no audio signal is applied to the amplifier—it is simply the start of the PWM of a zero audio signal (herein after "PWM zero-signal") that causes the transients. This will often result in easily audible clicks, which are not accepted in most audio applications. The traditional technique, with a relay at the output, can be used to avoid the transients; but a relay in the system has several disadvantages such as cost, required space and reliability. A second traditional approach to reduce the transients in PWM amplifiers is to start and stop the modulation only while the power supply voltage to the output stage is low. While the modulation is on, the power supply voltage is slowly ramped to or -from the desired operating value, depending on whether the modulation is to be started or stopped. This second traditional approach requires a power supply, capable of ramping the voltage up and down, which significantly increases complexity and cost.

In view of the foregoing, it would be desirable to have a method for minimizing the audio band energy in the start and stop transients associated with start-up, shut-down, mute and other changes of operational mode in switching audio amplifiers, such that the transients will be substantially inaudible.

SUMMARY OF THE INVENTION

The present invention is directed to a system and method for reducing audible turn-on and turn-off transients in switching amplifiers. The invention, according to one embodiment, employs a frequency shaped start sequence in front of a pulse width (PW) modulated zero-signal or a frequency shaped stop sequence following a PW modulated zero-signal.

According to one embodiment, the present invention comprises a method of reducing audible transients in a switching audio amplifier comprising the steps of:

providing a PWM amplifier responsive to a zero-signal delay control signal and a logic control signal to selectively start or stop modulation of a zero-signal; and selectively starting or stopping modulation of a zero-signal in response to the zero-signal delay control signal and the logic control signal such that an output signal generated by the PWM amplifier in response to a zero-signal received by the PWM amplifier will have a substantially reduced audible transient whenever the PWM amplifier starts or stops modulating the zero-signal.

According to another embodiment, the present invention comprises a switching amplifier audible transient reduction system comprising:

a modulator;

a delay control element operational to generate a delayed zero-signal in response to a zero-signal generated by the modulator; and a logic control element operational to cause the switching amplifier to generate an AD modulated zero-signal in response to the delayed zero-signal.

According to yet another embodiment, the present invention comprises a switching amplifier audible transient reduction system comprising:

a modulator;

a delay control element operational to generate a delayed zero-signal in response to a zero-signal generated by the modulator;

a combinational element operational to combine the delayed zero-signal with the zero-signal generated by the modulator to generate a combined zero-signal; and a switch operational to select the delayed zero-signal or the combined zero-signal such that the logic control element can operate to selectively cause the switching amplifier to generate the AD modulated zero-signal or an ABD modulated zero-signal.

According to still another embodiment, the present invention comprises a switching amplifier audible transient reduction system comprising:

modulating means for modulating a zero-signal;

delaying means for delaying the modulated zero-signal;

combining means for combining the delayed zero-signal with the modulated zero-signal to generate a combined zero-signal;

logic signaling means for generating a logic control signal; and switching means for selecting the delayed zero-signal or the combined zero-signal such that the logic signaling means can operate to selectively cause the switching amplifier to generate an AD modulated zero-signal or an ABD modulated zero-signal.

According to still another embodiment, the present invention comprises a switching amplifier audible transient reduction system comprising:

modulating means for generating a modulated zero-signal;

delaying means for generating a delayed zero-signal in response to the modulated zero-signal; and logic signaling means for generating a logic control signal such that the logic signaling means can operate to cause the switching amplifier to generate an AD modulated zero-signal in response to the delayed zero-signal.

According to yet another embodiment of the present invention, a method of reducing audible audio amplifier output transients comprises the steps of:

providing an audio amplifier having a signal input and configured to implement a predetermined modulation scheme;

receiving a zero audio input signal at the signal input of the audio amplifier;

adding a frequency shaped sequence of signal pulses to the zero audio input signal; and generating an audio amplifier output signal in response to the zero audio input signal and the frequency shaped sequence of signal pulses such that the audio amplifier output signal exhibits substantially no audible noise, wherein the frequency shaped sequence of signal pulses is predetermined by the modulation scheme.

The method may further comprise configuring the frequency shaped sequence of signal pulses such that the audio amplifier output signal exhibits substantially no audible noise prior to and/or subsequent to modulating the zero audio input signal.

Still another embodiment of the present invention comprises: A method of reducing audio switching amplifier output noise artifacts comprising the steps of:

providing a switching amplifier system comprising a pulse width modulator (PWM) operational in association with a predetermined modulation scheme and having a signal input, an output stage operational to receive input signals processed by the PWM to provide PWM output signals, and means for shaping signal transitions between switching amplifier system "ON" and "Mute" states associated with generation of the PWM output signals;

receiving an input signal via the PWM; and shaping signal transitions between switching amplifier system "ON" and "Mute" states to generate the PWM output signals, wherein the PWM output signals comprise a frequency shaped sequence of signal pulses such that the PWM output signals exhibit substantially less audible noise than PWM output signals generated by the switching amplifier system in the absence of signal transition shaping.

Still another embodiment of the present invention comprises: A switching amplifier system comprising:

a pulse width modulator (PWM) having a signal input; and an output stage operational to receive input signals processed by the PWM and provide PWM output signals therefrom, wherein the PWM output signals comprise a frequency shaped sequence of signals generated at least in part via a switching amplifier system signal transition shaping means such that noise artifacts associated with the PWM output signals are substantially less audible than noise artifacts associated with PWM output signals provided by the switching amplifier system in the absence of the signal transition shaping means.

In one aspect of the invention, a system and method functions to minimize audio band energy in the start and stop transients associated with start-up, shut-down, mute and other changes of operational mode in switching audio amplifiers, such that the transients will be inaudible in practice.

As used herein, amplifier "ON" state means the normal operating state of the amplifier, e.g. when playing audio or zero-audio (silence). The output stage is switching in the "ON" state.

As used herein, amplifier "MUTE" state means the amplifier is silent and no switching is happening in the output stage.

BRIEF DESCRIPTION OF THE DRAWINGS

Other aspects, features and many of the attendant advantages of the present invention will be readily appreciated as the invention become better understood by reference to the following detailed description when considered in connection with the accompanying drawings in which like reference numerals designate like parts throughout the figures thereof and wherein:

FIGS. 19(a)–19(f) are diagrams illustrating signal timing to obtain a reduced audibility of the start transients for both AD and ABD modes for the PWM amplifier shown in FIG. 18.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
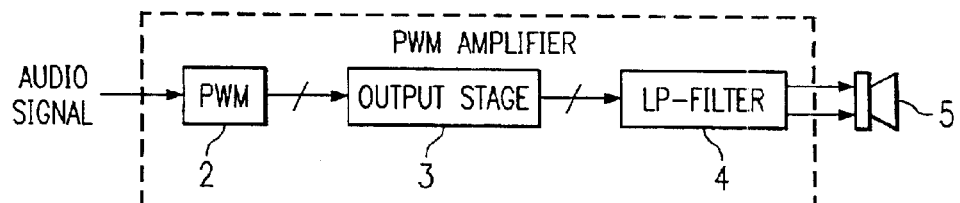
FIG. 1 is a diagram illustrating a general PWM amplifier system.

The concept of a PWM amplifier is illustrated in FIG. 1. In the PWM block 2, the audio signal is modulated into one or more PWM signals, which are then amplified in the output stage 3 of the amplifier. The amplified PWM signals, from the output stage 3 are then filtered in a low-pass filter 4 and communicated to a loudspeaker 5.

Figure 2:
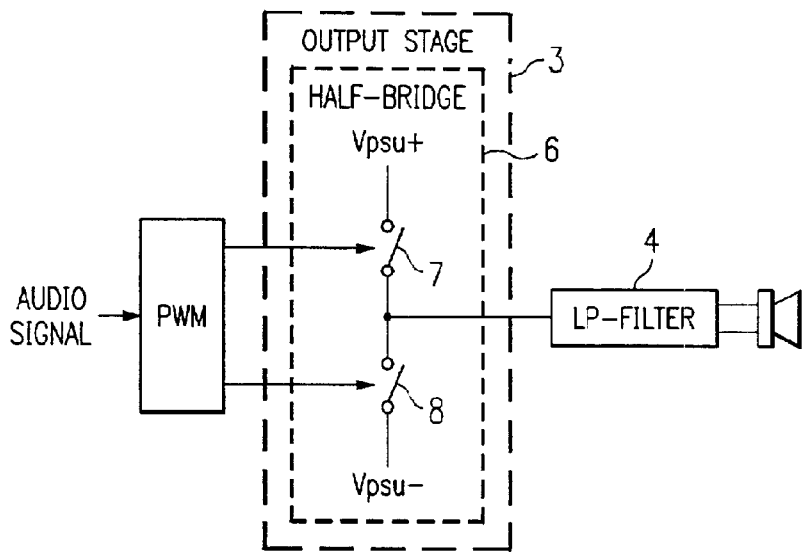
FIG. 2 is a diagram illustrating a special case of the amplifier system in FIG. 1, where a single half-bridge is used in the output stage.

Various sorts of modulation schemes can be used for PWM, e.g. AD, BD, ABD, etc. The topology of the output stage 3 and the low-pass filter 4 depends on the actual modulation scheme, but a simple topology using a single half-bridge 6 is shown in FIG. 2, and can be used for, e.g. AD modulation. The two switches 7, 8 in the output stage 3 have the possible states as shown in Table 1. In normal operation of the amplifier the output stage 3 will be in one of the number states 2 or 3. When the amplifier is turned off or in mute mode, the output stage 3 is usually in state number 1 (High-Z mode). The state number 4 must be avoided in any cases since the power supply is directly shorted in this state.

TABLE 1

| State Number | Upper Switch | Lower Switch | Output voltage | Output Impedance | Comments * |
|---|---|---|---|---|---|
| 1 | Off | Off | * | ∞ | Disconnection of the output -High-Z mode |
| 2 | Off | On | Vpsu- | 0 | Normal operation - Low Output |
| 3 | On | Off | Vpsu+ | 0 | Normal operation - High Output |
| 4 | On | On | * | * | Short circuit of the power supply - Illegal state |

Figure 3:
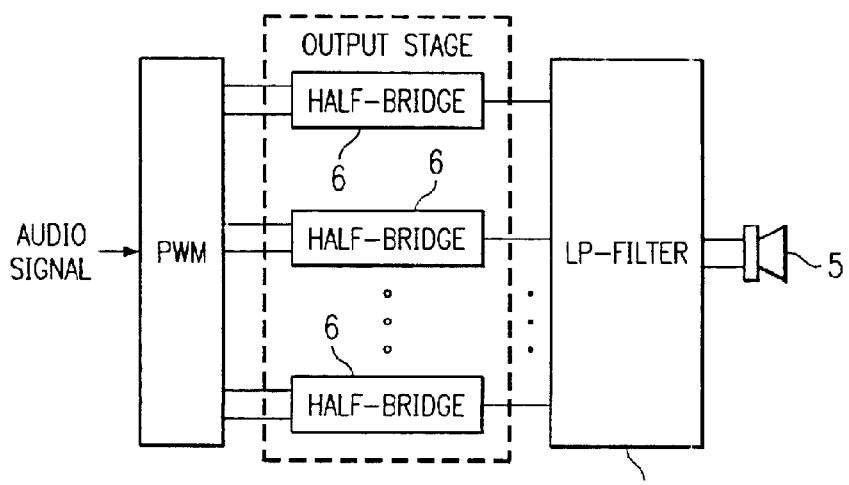
FIG. 3 is a diagram illustrating a general PWM amplifier, where one or more half-bridges are used.

The output stage can be expanded by using two or more half-bridges 6 as illustrated in FIG. 3. In topologies where multiple half-bridges 6 are used, each half-bridge 6 has the possible states as listed in Table 1. The output signals from the half-bridges 6 are then combined in the LP-filter 4, resulting in a differential signal, which drives the loudspeaker 5.

Figure 4A:
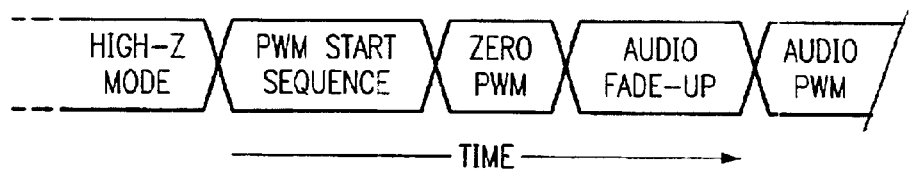
FIG. 4(a) is a diagram illustrating a typical timing of an amplifier during modulation start.
Figure 4B:
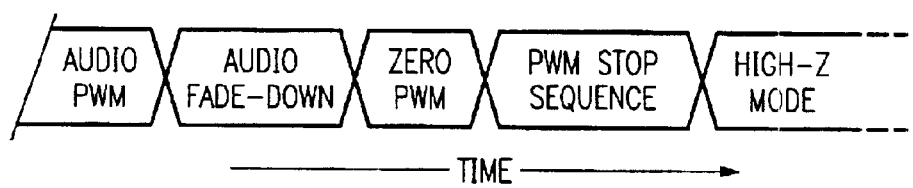
FIG. 4(b) is a diagram illustrating a typical timing of an amplifier during modulation stop.
Figure 5:
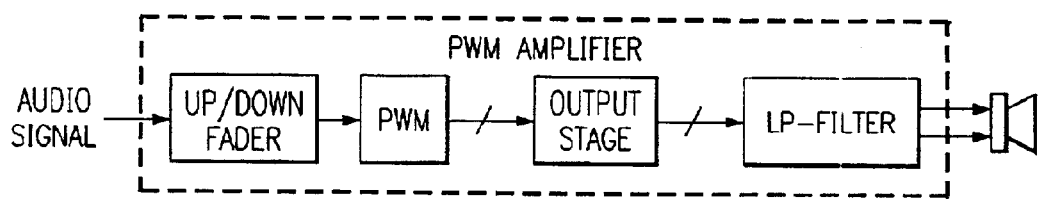
FIG. 5 is a diagram illustrating a PWM amplifier system, containing a fade up/down section.

To ensure there is no active audio signal present when the modulation is started, an up/down fader 9 can be inserted in the system as shown in FIG. 5. The fader 9 gradually increases/decreases the level of the audio signal, such that a smooth transition is made between a zero signal and the audio signal. The typical timing of the modulation start in such a system will be as shown in FIG. 4(a); while the corresponding timing for stopping the modulation is shown in FIG. 4(b). The fader 9 ensures that the audio signal is zero under the modulation start and -stop.

Figure 6:
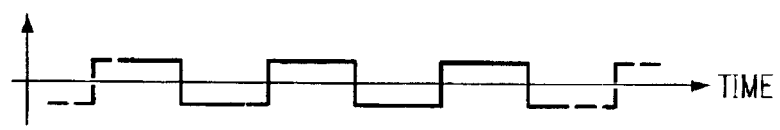
FIG. 6 is a diagram illustrating a PWM zero-signal, using AD modulation, which gives a modulated signal consisting of two discrete amplitude levels, and wherein the PWM zero-signal is suitable for use with output stages having a single half-bridge such as shown in FIG. 2.
Figure 7A:
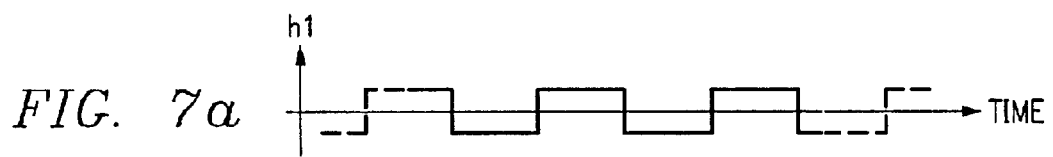
FIG. 7(a) is a diagram illustrating a PWM signal h1.
Figure 7B:
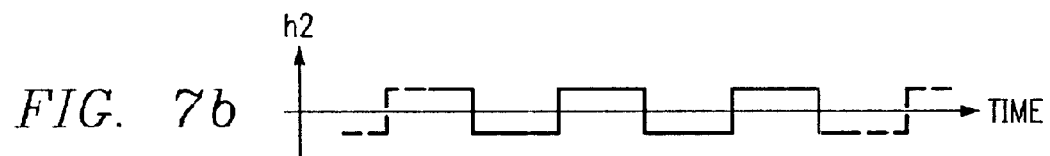
FIG. 7(b) is a diagram illustrating yet another PWM signal h2.
Figure 7C:
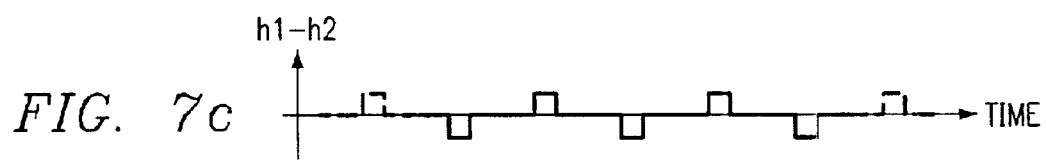
FIG. 7(c) illustrates an ABD modulated PWM zero-signal consisting of three discrete amplitude levels and that is generated by subtraction of the PWM signals h1 and h2 depicted in FIGS. 7(a) and 7(b) respectively.
Figure 8A:
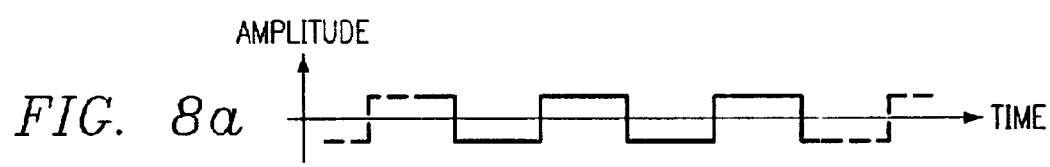
FIG. 8(a) is a diagram illustrating an AD modulated zero-signal consisting of two discrete amplitude levels.
Figure 8B:
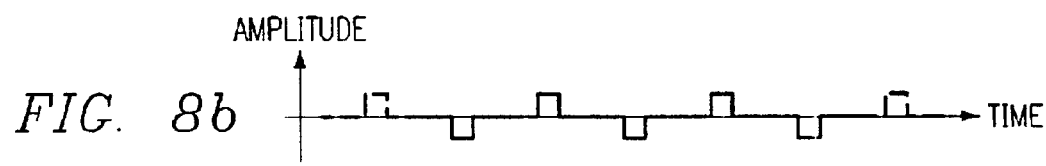
FIG. 8(b) is a diagram illustrating an ABD modulated zero-signal consisting of three discrete amplitude levels.
Figure 9A:
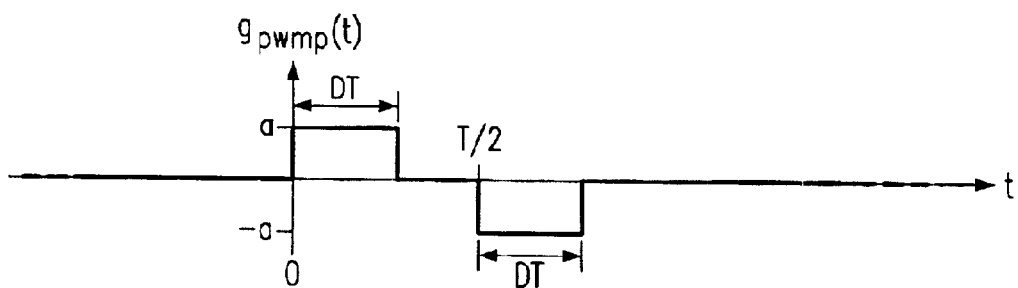
FIGS. 9(a)–9(d) are diagrams illustrating synthesis of the start of a PWM zero-signal.
Figure 9B:
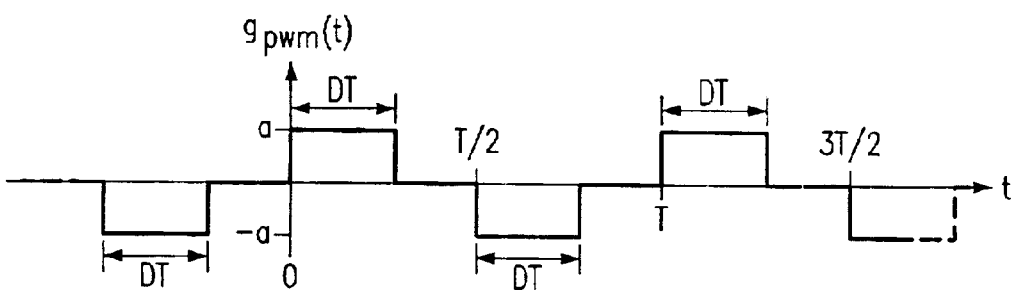
Figure 9C:
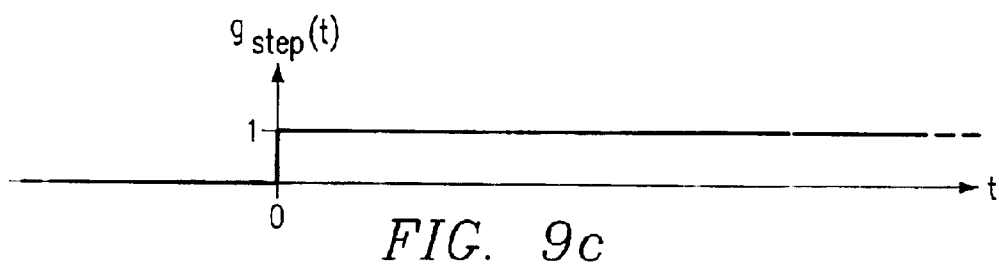
Figure 9D:
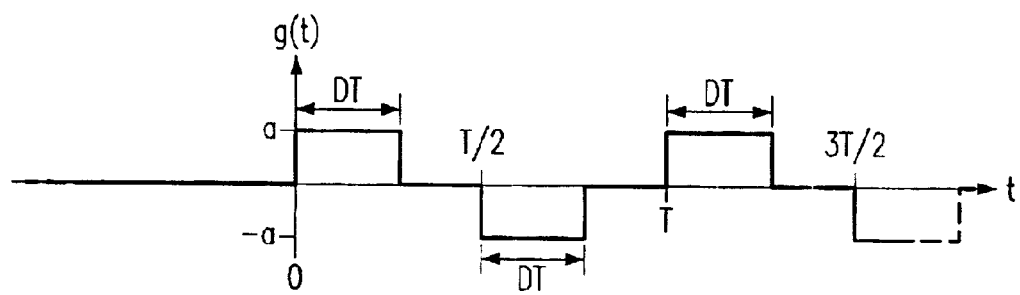

It is consequently the PWM of the zero audio signal (PWM zero-signal) that is interesting, since the transients from the modulation start or -stop, occur when a zero audio signal is applied to the PWM block 2 of the amplifier (see FIG. 5). FIGS. 6 and 7 illustrate some common PWM zero-signals. Specifically, FIGS. 6 and 8(a) each show a PWM zero-signal, using AD modulation, which gives a modulated signal consisting of two discrete amplitude levels. The AD modulation can be used for output stages with a single half-bridge 6 like illustrated in FIG. 2. FIGS. 7(c) and 9(b) each show an ABD modulated PWM zero-signal consisting of three discrete amplitude levels. The ABD PWM zero-signal depicted in FIG. 7(c) is generated by subtraction of two PWM signals h1 and h2, shown in FIGS. 7(a) and 7(b) respectively. The two PWM signals h1 and h2 are amplified by separate half-bridges 6 in the output stage 3; hence when using ABD modulation the output stage 3 must contain at least two half-bridges 6. The subtraction of the two PWM signals is done in the output filter 4, which communicates the resulting differential signal to the loudspeaker 5.

Common to all PWM modulation schemes is the property that square pulses always can synthesize the PWM sequences, which makes a general analysis of the associated transients easier.

In order to provide a better understanding of the embodiments presented herein below regarding the present invention, a discussion is first set forth with reference being made to FIGS. 9(a)–9(d) regarding the spectrum of traditional PWM start sequences. Specifically, FIGS. 9(a)–9(d) are diagrams illustrating synthesis of the start of a PWM zero-signal. Looking now at FIGS. 9(a)–9(d), the spectrum $G_{pwmp}(f)$ of the signal $g_{pwmp}(t)$ is given by $$G_{pwmp}(f) = aDT \frac{\sin(\pi fDT)}{\pi fDT} e^{-i\pi DT}(1 - e^{-i\pi fT}), 0 \le D \le \frac{1}{2} \quad (1)$$

The signal $g_{pwm}(t)$ is formed by a repetition of $g_{pwmp}(t)$ with the period T. The Fourier series $G_{pwm}(m)$ of the periodic signal $g_{pwm}(t)$ then becomes $$G_{pwm}(m) = \frac{1}{T} G_{pwmp}\left(\frac{m}{T}\right) = aD \frac{\sin(\pi mD)}{\pi mD} e^{-i\pi mD}(1 - e^{-i\pi m}) \Leftrightarrow \quad (2)$$

$$G_{pwm}(m) = \begin{cases} 2aD \dfrac{\sin(\pi mD)}{\pi mD} \cdot e^{-i\pi mD}, & m \text{ odd} \\ 0 & m \text{ even} \end{cases}$$

A special case arises for D=½. This value of D is interesting since it corresponds to an AD PWM modulated zero-signal. The expression for the Fourier series can in this case be reduced to $$G_{pwm,ad}(m) = \begin{cases} \dfrac{-2ai}{\pi m}, & m \text{ odd} \\ 0, & m \text{ even} \end{cases} \quad (3)$$

The spectrum $G_{step}(f)$ of the step signal $g_{step}(t)$ is found by using the Laplace transform of the signal. This gives the well-known result $$G_{step}(f) = \frac{1}{i2\pi f} \quad (4)$$

The PWM start signal g(t) can be synthesized by the periodic PWM signal $g_{pwm}$ (t) multiplied by the step signal $g_{step}$ (t). Hence, the spectrum G(f) of the signal g(t) is calculated by the convolution $$G(f) = G_{pwm}(m) * G_{step}(f) = \sum_{m=-\infty}^{\infty} G_{pwm}(m) G_{step}\left(-\frac{m}{T} + f\right), f \neq \frac{m}{T} \quad (5)$$

The spectrum G(f) is not defined when f equals the harmonic frequencies, m/T of $G_{pwm}$(m), since $G_{step}$(f)→∞ for f→0. The frequency range of interest is 0<f<1/T, since the audio frequency band always is smaller than the frequency 1/T, the first harmonic component of the PWM signal. Only positive frequencies need to be evaluated since the amplitude of the spectrum is symmetrical in f=0 and the phase is odd symmetrical in f=0 (due to real time signals). In this frequency range, G(f) is defined and can be evaluated, when the well-known limit value of 1 for a sinc function in zero is used. It can be easily shown that $$|G_{pwm}(m)| \leq \frac{2a}{\pi|m|} \quad (6)$$

Hence, $$|G_{pwm}(m) G_{step}(f)| \leq \frac{2a}{\pi|m|} \frac{1}{2\pi|f|} \quad (7)$$

For a limited sum in the approximated calculation of G(f), the following holds:

$$G(f) = \sum_{m=-N}^{N} G_{pwm}(m) G_{step}\left(-\frac{m}{T} + f\right) + E, \; 0 < f < \frac{1}{T}$$

where $$|E| < \sum_{\pm N}^{\pm\infty} \frac{2a}{\pi|m|} \frac{1}{2\pi\left|\frac{m}{T}\right|} = \frac{aT}{\pi^2} \sum_{m=\pm N}^{\pm\infty} \frac{1}{m^2} = \frac{2aT}{\pi^2} \sum_{m=N}^{\infty} \frac{1}{m^2} < \frac{2aT}{\pi^2} \int_{N-1}^{\infty} \frac{1}{m^2} dm \Leftrightarrow$$

$$|E| < \frac{2aT}{\pi^2(N-1)} \quad (9)$$

The error E caused by using the finite sum in the calculation of G(f) is in other words limited by equation (9).

An interesting characteristic that provides information about the audibility of the start transient is the energy in the audio band. The energy in the audio band $E_a$ of a real signal h(t) is calculated as $$E_a = \int_{-fa}^{fa} |H(f)|^2 df = 2 \int_{0}^{fa} |H(f)|^2 df \quad (10)$$

where H(f) is the Fourier transform of h(t) and fa is the maximum audio band frequency.

Figure 10:
FIG. 10 is a diagram illustrating the start of an AD PWM zero-signal.

FIG. 10 is a diagram illustrating the traditional start of an AD PWM zero-signal. The spectrum of this start, corresponding to D=½, is provided by equation (5) that is rewritten herein below as equation (11).

$$G_{ad}(f) = \frac{a}{\pi^2} \sum_{m=\pm 1, \pm 3, \ldots}^{\pm\infty} \frac{1}{m \cdot \left(\frac{m}{T} - f\right)} \quad (11)$$

The spectrum $G_{ad}$(f) is principally not defined for f=0, but the limit-value of $G_{ad}$(f) for f→0 is found to be $$\lim_{f \to 0} G_{ad}(f) = \frac{aT}{\pi^2} \sum_{m=\pm 1, \pm 3, \ldots}^{\infty} \frac{1}{m^2} = \frac{aT}{4}. \quad (12)$$

The spectrum of the AD PWM zero-signal start is consequently non-zero for f→0, which means that a DC-value is present in the start transient.

Figure 11:
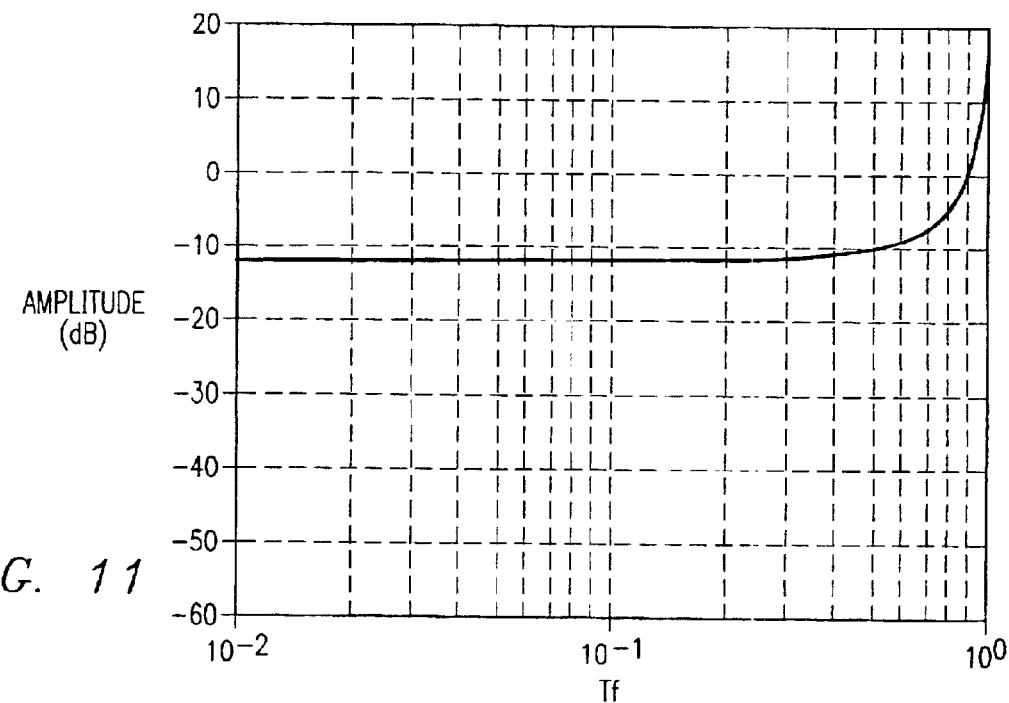
FIG. 11 is a diagram illustrating the spectrum of the AD PWM zero-signal shown in FIG. 10.

FIG. 11 is a diagram illustrating the spectrum of the AD PWM zero-signal start shown in FIG. 10 for a=1. The spectrum is almost constant in the audio band (f<<1/T), and this PWM start is very audible. For fa=1/(20·T), the relative transient energy in the audio band (transient energy/ switching period T) is calculated numerically to be −22.0 dB.

Figure 12:
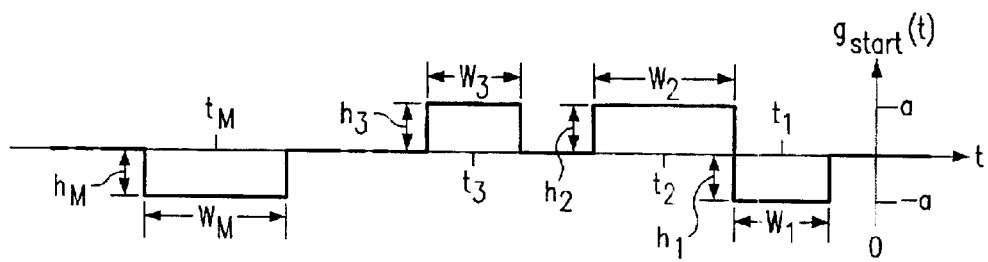
FIG. 12 is a diagram illustrating the start sequence of square pulses that can be added in front of a PWM modulated zero-signal to shape the spectrum of the resulting signal.

FIG. 12 is a diagram illustrating the start sequence of square pulses that can be added in front of a PWM modulated zero-signal to shape the spectrum of the resulting signal so that the start transient has minimum energy in the audio band. A start sequence can consist of square pulses with amplitudes h on a or −a, defined by the position of the pulse center t and pulse width w. The start signal must be valid corresponding to the particular output stage. For an H-bridge type output stage (i.e. using two half-bridges), an output amplitude at zero is possible in addition to ±a. When a single half-bridge is used, only the amplitudes ±a are possible under normal modulation, and zero amplitudes between the pulses in the start sequence must be avoided. The spectrum $G_{start}$(f) of the PWM start sequence shown in FIG. 12 is $$G_{start}(f) = \sum_{k=1}^{M} h_k w_k \frac{\sin(\pi f w_k)}{\pi f w_k} e^{-i 2\pi f \, t_k} \quad (13)$$

When the start signal $g_{start}$ (t) is added to the PWM zero signal g(t), the resulting spectrum $G_{res}$ (f) becomes $$G_{res}(f) = G_{start}(f) + G(f) \quad (14)$$

It is desirable to reduce the audibility of the resulting signal, e.g. by reducing the energy in the audio band. This can be implemented analytically or via numerical minimization of the energy, by means of equation (10) discussed herein before. One example can be examined by considering the limit value of the spectrum of an AD PWM zero-start as f→0. A very simple PWM sequence such as shown in FIG. 13(b) consists of a single pulse with a DC-value, which cancels the DC-value of the PWM zero-signal, i.e.

$$G_{start}(0) = -\frac{aT}{4}. \quad (15)$$

When the start sequence has this DC-value, the limit value of the resulting spectrum G(f) as f→0 is zero. A single start pulse with this DC value can be one of height h1 and width $w_1$, where $$h_1 = -a \quad \text{and} \quad w_1 = \frac{T}{4}. \quad (16)$$

Figure 13A:
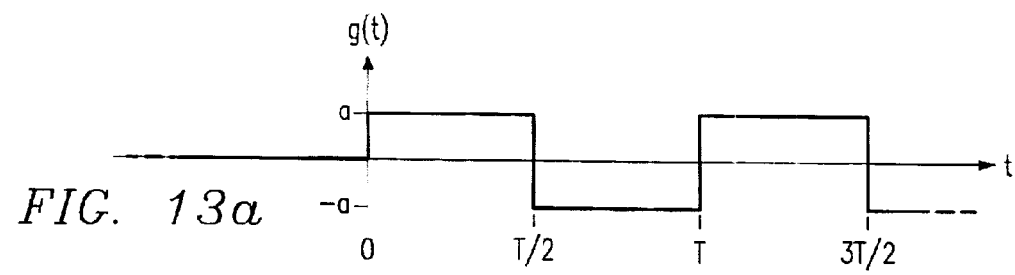
FIGS. 13(a)–13(c) are diagrams illustrating a single start pulse added to an AD PWM zero-signal.
Figure 13B:
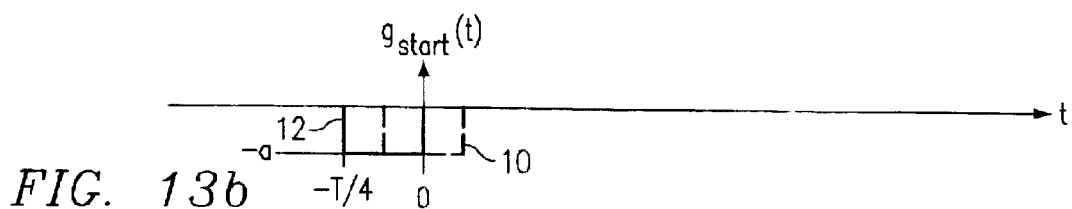
Figure 13C:
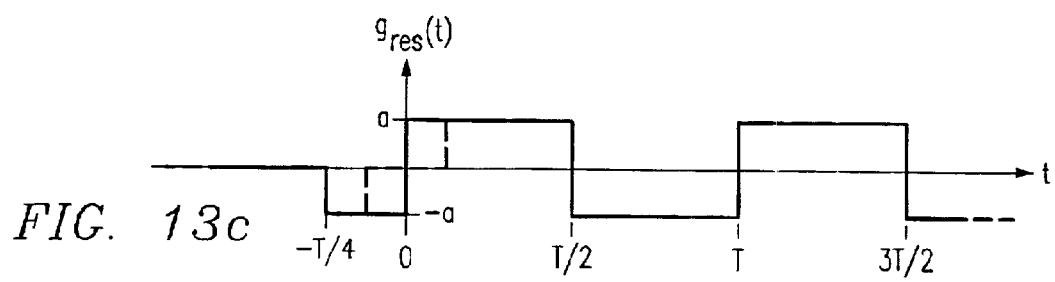
Figure 14:
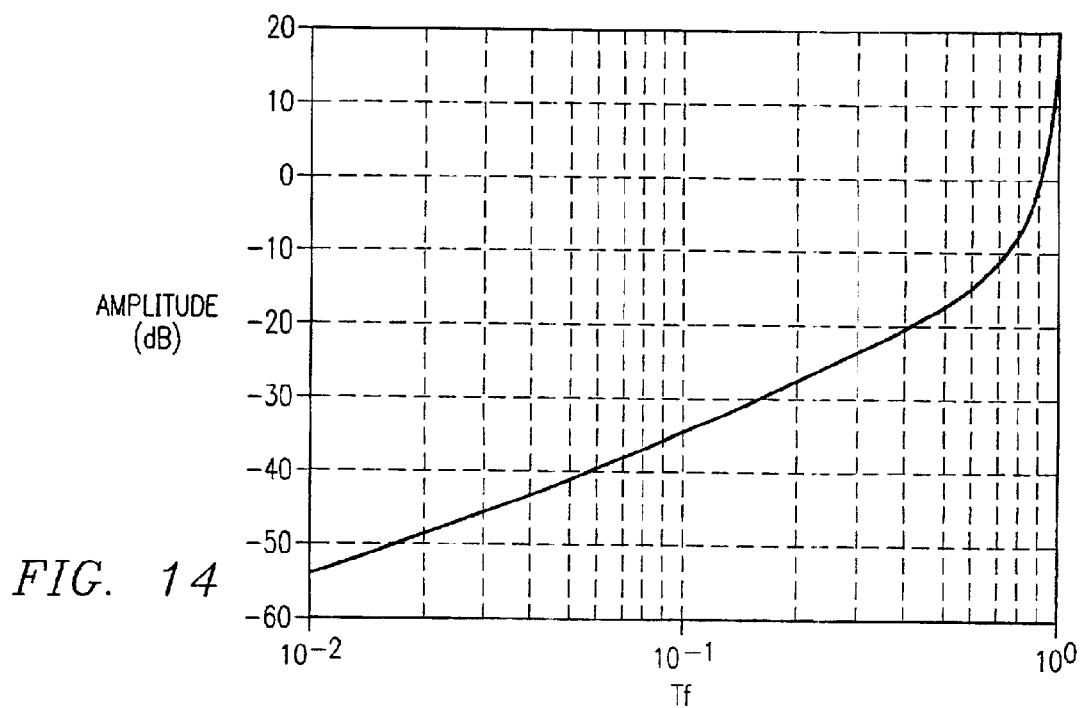
FIG. 14 is a diagram illustrating the signal spectrum resulting from process depicted in FIGS. 13(a)–13(c)

The start pulse center can be positioned at $t_1=0$, as depicted in dotted line 10 in FIG. 13(*b*); but this results in an amplitude value at zero, between the pulses, which are not allowed in output stages using a single half-bridge, e.g. designed for AD modulation. In this case, the pulse 10 can be placed just in front of $t_1=0$, as shown by solid line 12 in FIG. 13(*b*). FIG. 13(*a*) is a diagram illustrating one possible PWM zero-signal start; while FIG. 13(*c*) depicts the PWM zero-signal start shown in FIG. 13(*a*) preceded by the start pulse 12. The magnitude of the spectrum $G_{res}(f)$ of $g_{res}(f)$ in this case is illustrated in FIG. 14. It can be seen from FIG. 14 that the added start pulse $g_{start}(t)$ reduces the transient energy significantly at low frequencies. For fa=1/(20·T), the relative transient energy in the audio band was calculated to be −54.9 dB, demonstrating a reduction of 22.9 dB when compared to the transient energy associated with the AD PWM zero-signal start described herein before with reference to FIGS. 10 and 11. Further, it is noted that the form of the spectrum is altered to one having a first-order positive slope. It can readily be appreciated that modifications will often be minimal for implementing this type of modulation start to reduce the audibility of the start transient.

Figure 15A:
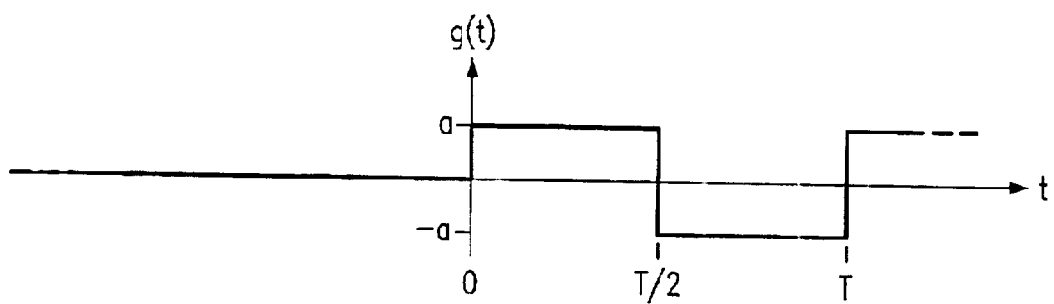
FIGS. 15(a)–15(c) are diagrams illustrating a start sequence added to an AD PWM zero-signal.
Figure 15B:
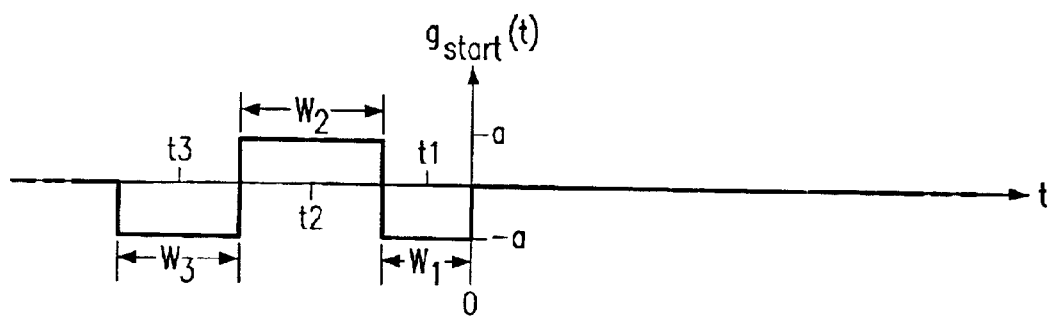
Figure 15C:
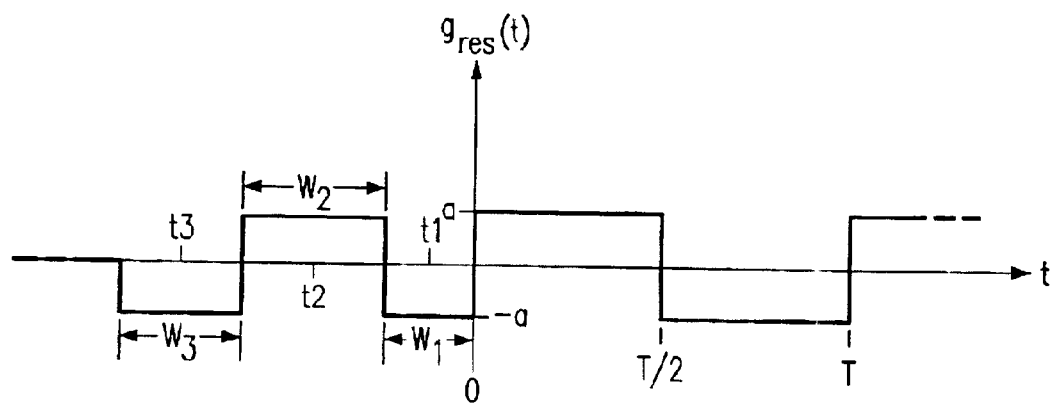

The spectrum of a PWM start can be shaped by numerical optimization as stated herein before. FIGS. 15(*a*)–15(*c*) are diagrams illustrating a start sequence consisting of 3 pulses added to an AD PWM zero-signal start. A PWM start sequence, $g_{start}(t)$, shown in FIG. 15(*b*), is added to the PWM zero-signal start, shown in FIG. 15(*a*), to provide the resulting start sequence, $g_{res}(t)$, shown in FIG. 15(*c*) and to minimize the audibility of the resulting start transient. The PWM start sequence, $g_{start}(t)$, is defined by three parameters, $w_1$, $w_2$ and $w_3$; and the transient energy of the resulting signal $g_{res}$ (t), depicted in FIG. 15(*c*), can be minimized in the audio band by adjusting those parameters. The maximum audio band frequency is fa=1/(20·T) as stated herein before. In the instant case, it can be shown that the DC-value of the added start sequence $g_{start}(t)$ depicted in FIG. 15(*b*) must be −aT/4 to ensure a neutral DC-value of the resulting signal $g_{res}(t)$ shown in FIG. 15(*c*). By this constraint, the number of free parameters is reduced to two, i.e.

$$G_{start}(0) = \quad (17)$$
$$\frac{-aT}{4} \Leftrightarrow a \cdot (-w_1 + w_2 - w_3) = \frac{-aT}{4} \Leftrightarrow w_3 = \frac{T}{4} - w_1 + w_2$$

Hence, the transient energy $E_a$ in the audio band, can be expressed as a function of $w_1$, and $w_2$:

$$E_a(w_1, w_2) = \quad (18)$$

$$\int_0^{fa} \left| \sum_{k=1}^{3} h_k w_k \frac{\sin \pi f w_k}{\pi f w_k} e^{-i2\pi f t_k} + \sum_{m=\pm 1,\pm 3,\ldots}^{\pm \infty} \frac{1}{m\left(\frac{m}{T} - f\right)} \right|^2 df$$

$E_a$ can be evaluated by means of an approximated numerical integration and limited summing of the infinite serial, which gives some limited errors in the calculation. The error E from limiting the number of terms in the unlimited sum is bounded by equation (9). The error from doing a numerical integration depends on the actual method. The value of $E_a$ is found for various values of $w_1$ and $w_2$ to produce FIG. 16 that illustrates transient energy in the audio band for various values of start sequence pulse widths. The minimum transient energy in the audio band is found for the parameters $w_1$=0.4748·T, $w_2$=0.3639·T and $w_3$=0.1391·T, and the corresponding point is shown as point "p1" in FIG. 16. The value of $E_a$ at point "p1" was found to be −115.8 dB; and the corresponding frequency spectrum for the above parameter set is illustrated in FIG. 17 that is a diagram illustrating the spectrum of the start transient for parameters corresponding to minimum energy in the audio band for specific start sequence pulse width values.

Figure 16:
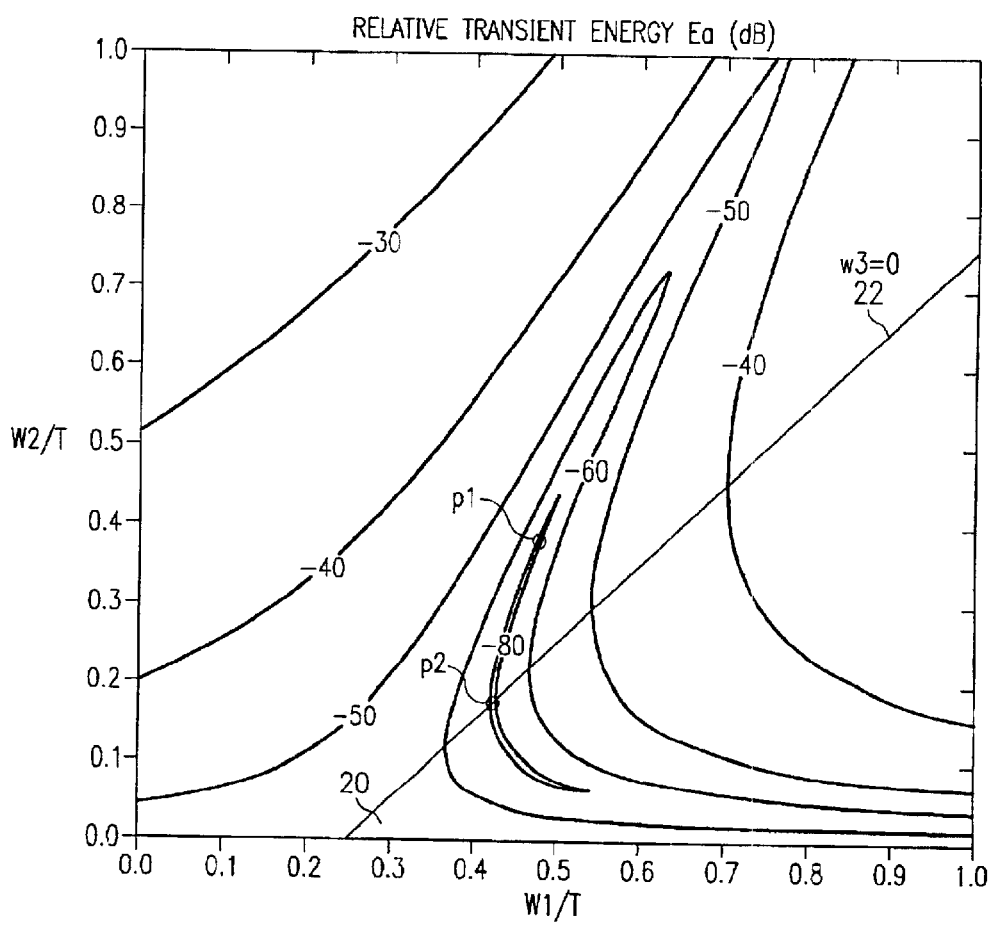
FIG. 16 is a diagram illustrating transient energy in the audio band for various values of start sequence pulse width values.
Figure 17:
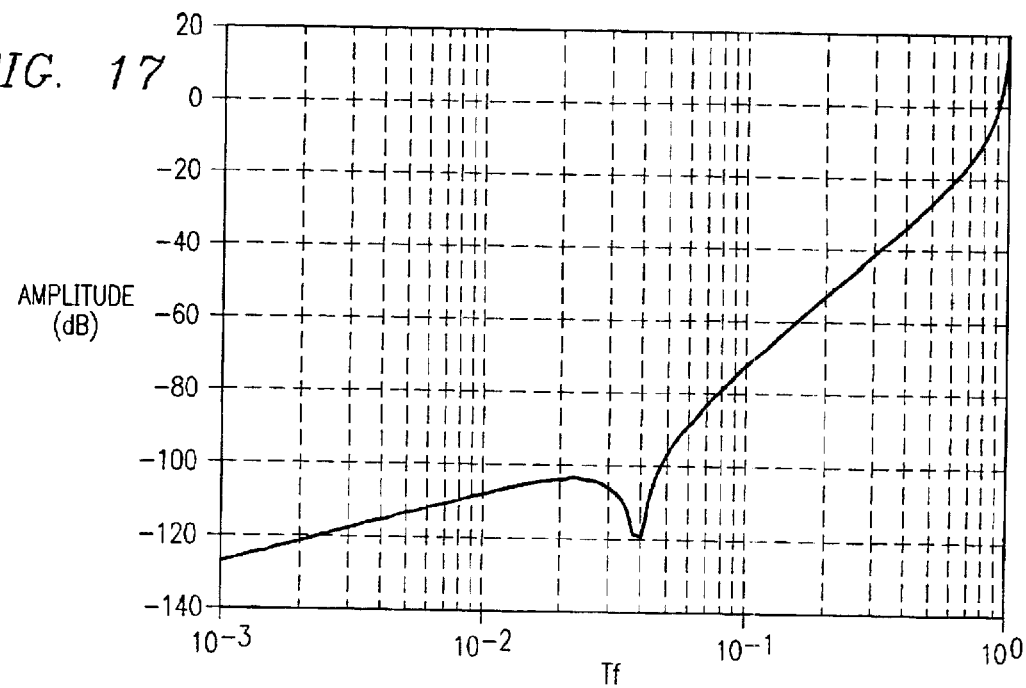
FIG. 17 is a diagram illustrating the spectrum of the start transient for parameters corresponding to minimum energy in the audio band for specific start sequence pulse width values.

Looking again at FIG. 16, it can be determined that $w_3$ is negative in the hatched area 20, (which makes no sense since negative values of $w_3$ are not allowed). The upper edge 22 of the hatched area 20 is the special case where $w_3$=0. In this case, the start sequence only consists of two pulses ($w_1$ and $w_2$), and is therefore estimated to be simpler to implement. The lowest relative transient energy in the audio band, for $w_3$=0, is −82.1 dB, at $w_1$=0.4268·T and $w_2$=0.1768·T, corresponding to the point marked "p2" in FIG. 16.

The start sequence discussed herein before with reference to FIGS. 13(*a*)–13(*c*) and FIG. 14 is present in the parameter space depicted in FIG. 16, at the line where $w_2$=0, since the two pulses of widths $w_1$ and $w_3$ respectively, merge into a single resulting negative pulse of width −aT/4 (because of the DC constraint discussed above). The relative transient energy in the audio band $E_a$ on this line is −54.9 dB, similar to the value determined herein before the example set forth regarding FIGS. 13(*a*)–13(*c*) and FIG. 14.

Figure 18:
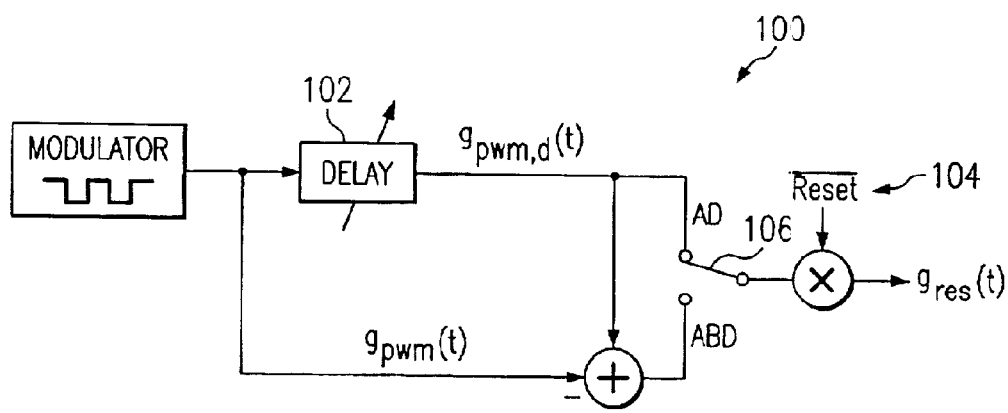
FIG. 18 is a block diagram of a PWM amplifier suitable for starting modulation of a zero-signal in AD or ABD modulation modes.

FIG. 18 is a block diagram of a PWM amplifier model 100 suitable for starting modulation of a zero-signal in AD or ABD modulation modes. The delay 102 and the not-reset signal 104 are functions of time and are used to reduce the energy of the transients in the audio band in the resulting output signal $g_{res}(t)$. The not-reset signal 104 is one or zero, and the delay 102 is positive. The switch 106 controls whether the PWM amplifier model 100 modulator uses AD or ABD modulation; and in both positions, the audible start transients are substantially small compared to the traditional way in which to start a PWM zero-signal. The bounded topology of the PWM amplifier model 100 shown in FIG. 18 limits the possibilities for reducing the transients; but still a considerable improvement can be implemented in both AD and ABD modulation modes. The present invention is not so limited however, and it will readily be appreciated by those skilled in the art the present invention can easily be extended to any system capable of reducing audible turn-on and turn-off transients in switching amplifiers by using special start and stop switching sequences with a spectrum shaped so that the transient energy in the audible frequency range is minimized.

FIGS. 19(*a*)–19(*f*) are diagrams illustrating signal timing to obtain a reduced audibility of the start transients for both AD and ABD modes for the PWM amplifier model 100 shown in FIG. 18. Specifically, FIGS. 19(*a*)–(*f*) depict one special example of start sequence timing that reduces the start transients both in AD and ABD modulation modes. The resulting output signals for AD and ABD modulation modes are $g_{res,ad}$ (t) and $g_{res,abd}$ (t) respectively. The spectra of the transients are calculated numerically and illustrated in FIG. 20. The relative energy in the audio band for fa=1/(20·T) is −48.3 dB and −60.0 dB for the resulting transient AD and ABD modes respectively. Considerable reductions of the transients for the PWM amplifier model 100 are achieved then, by simple, but accurate timing of the not-reset control signal 104 and the delay 102 necessary for the ABD modulation mode.

Figure 20:
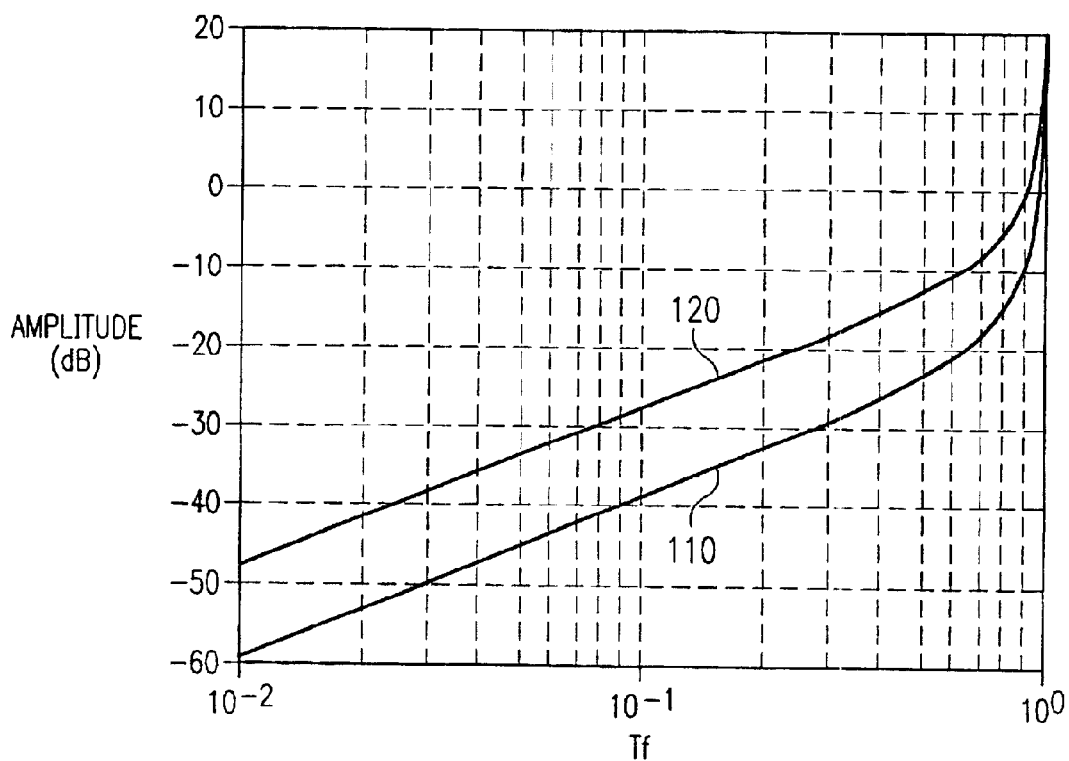
FIG. 20 is a diagram illustrating signal spectrums corresponding to the start transient in both AD modulation and ABD modulation for the PWM amplifier shown in FIG. 18.

FIG. 20 is a diagram illustrating signal spectrums corresponding to the start transient in both AD modulation and ABD modulation for the PWM amplifier model 100 shown in FIG. 18. Dotted line 110 depicts the spectrum of the signal $g_{res,ad}(t)$, corresponding to the start transient in AD modulation, while solid line 120 depicts the spectrum of the signal $g_{res,abd}(t)$, corresponding to the start transient in ABD modulation.

This invention has been described in considerable detail in order to provide those skilled in the switching amplifier art with the information need to apply the novel principles and to construct and use such specialized components as are required. Further details directed to specific modulation techniques such as, but not limited to "ABD" modulation, have not been provided herein to provide clarity and brevity in describing the particular detailed embodiments of the invention, and since these modulation techniques are also well known to those skilled in the art. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims, which follow. All of the foregoing embodiments set forth above for example, were based on the start of modulation from a zero state in the amplifier. Accurately, the same principles apply for the modulation stop in a PWM amplifier, since only the direction of time is shifted in this case. Those skilled in the art readily appreciate that the time shift of a signal only affects the phase and not the amplitude of the spectrum; and calculations of the transient energy in the audio band therefore hold for reverse time as well. A reversed start sequence can consequently be used as a stop sequence when the modulation of the zero-signal is stopped; and in this case, also reduces the audible transient.

What is claimed is:

1. A method of reducing audio switching amplifier output noise artifacts comprising the steps of:

providing a switching amplifier system comprising a pulse width modulator (PWM) operational in association with a predetermined modulation scheme and having a signal input, an output stage operational to receive input signals processed by the PWM to provide PWM output signals and having a switching amplifier "ON", "Mute", and "Off" states, and means for shaping signal transitions between switching amplifier system "ON" and "Mute" states associated with generation of the PWM output signals;

receiving an input signal via the PWM; and shaping signal transitions between said switching amplifier system "ON" and "Mute" states to generate the PWM output signals, wherein the PWM output signals comprise a frequency shaped sequence of signal pulses such that the PWM output signals exhibit substantially less audible noise than PWM output signals generated by the switching amplifier system in the absence of signal transition shaping.

2. The method according to claim 1 wherein the frequency shaped sequence of signal pulses is predetermined by the modulation scheme.

3. The method according to claim 1 wherein the input signal is a zero audio signal (PWM zero-signal).

4. The method according to claim 1 wherein the input signal is an audio signal.

5. A method of reducing switching amplifier output noise artifacts comprising the steps of:

providing a switching amplifier system having switching amplifier "ON", "Mute", and "Off" states comprising:
a pulse width modulator (PWM) having a signal input;
an output stage operational to receive input signals processed by the PWM and generate PWM output signals therefrom; and
a signal shaper;

receiving an input signal via the PWM; and shaping signal transitions associated with the PWM output signals caused by said switching amplifier system "ON" and "Mute" states such that the PWM output signals comprise a frequency shaped sequence of signal pulses that exhibit substantially less audible noise than PWM output signals generated by the switching amplifier system in the absence of signal transition shaping.

6. The method according to claim 5 wherein the frequency shaped sequence of signal pulses is predetermined by the modulation scheme employed by the PWM.

7. The method according to claim 5 wherein the input signal is a zero audio signal (PWM zero-signal).

8. The method according to claim 5 wherein the input signal is an audio signal.

* * * * *

UNITED STATES PATENT AND TRADEMARK OFFICE
CERTIFICATE OF CORRECTION

PATENT NO. : 6,720,825 B2  
APPLICATION NO. : 10/104853  
DATED : April 13, 2004  
INVENTOR(S) : Thomas H. Hansen, Lars Risbo and Venkateswar R. Kowkutla Page 1 of 1

It is certified that error appears in the above-identified patent and that said Letters Patent is hereby corrected as shown below:

On the title page add the following before (65) Prior Publication Date:

Related U.S. Application Data
(60) Provisional application No. 60/298,786, filed on June 15, 2001.

Signed and Sealed this

Eleventh Day of August, 2009

David J. Kappos
*Director of the United States Patent and Trademark Office*